United States Patent
Lu et al.

(10) Patent No.: US 10,373,958 B2
(45) Date of Patent: Aug. 6, 2019

(54) SEMICONDUCTOR DEVICE HAVING A MULTI-THICKNESS GATE TRENCH DIELECTRIC LAYER

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Tsuo-Wen Lu, Kaohsiung (TW); Ger-Pin Lin, Tainan (TW); Tien-Chen Chan, Tainan (TW); Shu-Yen Chan, Changhua County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/876,216

(22) Filed: Jan. 22, 2018

(65) Prior Publication Data

US 2019/0035792 A1      Jan. 31, 2019

(30) Foreign Application Priority Data

Jul. 31, 2017  (CN) .......................... 2017 1 0637712

(51) Int. Cl.
| | | |
|---|---|---|
| H01L 27/10 | (2006.01) | |
| H01L 29/49 | (2006.01) | |
| H01L 29/51 | (2006.01) | |
| H01L 27/108 | (2006.01) | |
| H01L 29/423 | (2006.01) | |
| H01L 21/02 | (2006.01) | |

(Continued)

(52) U.S. Cl.
CPC .... *H01L 27/10823* (2013.01); *H01L 21/0228* (2013.01); *H01L 21/02164* (2013.01); *H01L 21/28088* (2013.01); *H01L 21/28194* (2013.01); *H01L 27/10876* (2013.01); *H01L 29/4236* (2013.01); *H01L 29/42368* (2013.01); *H01L 29/51* (2013.01); *H01L 29/66621* (2013.01); *H01L 29/4966* (2013.01)

(58) Field of Classification Search
CPC ......... H01L 27/10823; H01L 27/10876; H01L 29/4236; H01L 29/42368; H01L 29/4966; H01L 29/51
See application file for complete search history.

(56) References Cited

U.S. PATENT DOCUMENTS 4,763,177 A * 8/1988 Paterson ............. H01L 29/7885
                                                         257/315
4,890,144 A * 12/1989 Teng ................... H01L 27/0629
                                                         257/66

(Continued)

*Primary Examiner* — Ida M Soward
(74) *Attorney, Agent, or Firm* — Winston Hsu

(57) ABSTRACT

A semiconductor device includes a semiconductor substrate having a gate trench including an upper trench and a lower trench. The upper trench is wider than the lower trench. A gate is embedded in the gate trench. The gate includes an upper portion and a lower portion. A first gate dielectric layer is between the upper portion and a sidewall of the upper trench. The first gate dielectric layer has a first thickness. A second gate dielectric layer is between the lower portion and a sidewall of the lower trench and between the lower portion and a bottom surface of the lower trench. The second gate dielectric layer has a second thickness that is smaller than the first thickness.

9 Claims, 5 Drawing Sheets

(51) Int. Cl.
*H01L 21/28* (2006.01)
*H01L 29/66* (2006.01)

(56) References Cited

U.S. PATENT DOCUMENTS

| | | | | |
|---|---|---|---|---|
| 4,954,854 A | * | 9/1990 | Dhong | H01L 21/2236 257/332 |
| 4,969,022 A | * | 11/1990 | Nishimoto | H01L 27/10829 257/301 |
| 5,319,228 A | * | 6/1994 | Ozaki | H01L 27/10829 257/304 |
| 5,411,905 A | * | 5/1995 | Acovic | H01L 21/28273 257/E21.209 |
| 5,443,992 A | * | 8/1995 | Risch | H01L 27/092 257/329 |
| 5,512,517 A | * | 4/1996 | Bryant | H01L 29/1037 257/E21.409 |
| 5,637,898 A | * | 6/1997 | Baliga | H01L 29/0878 257/330 |
| 5,646,052 A | * | 7/1997 | Lee | H01L 21/76202 257/397 |
| 6,225,659 B1 | * | 5/2001 | Liu | H01L 21/28273 257/314 |
| 6,967,147 B1 | | 11/2005 | Tews | |
| 7,382,019 B2 | * | 6/2008 | Marchant | H01L 29/7813 257/330 |
| 7,985,651 B2 | * | 7/2011 | Lee | H01L 21/26586 257/E21.41 |
| 8,343,829 B2 | * | 1/2013 | Wang | H01L 21/26506 438/243 |
| 8,853,029 B2 | * | 10/2014 | Denison | H01L 29/42368 438/268 |
| 8,999,769 B2 | * | 4/2015 | Verma | H01L 21/82385 257/330 |
| 9,356,022 B2 | * | 5/2016 | Lee | H01L 27/0629 |
| 9,570,318 B1 | * | 2/2017 | Cho | H01L 29/66545 |
| 2002/0121663 A1 | * | 9/2002 | Azam | H01L 21/823487 257/330 |
| 2002/0153557 A1 | * | 10/2002 | Hurst | H01L 29/42368 257/329 |
| 2008/0166846 A1 | * | 7/2008 | Marchant | H01L 29/7813 438/270 |
| 2010/0230747 A1 | * | 9/2010 | Barletta | H01L 29/42368 257/334 |
| 2010/0301410 A1 | * | 12/2010 | Hider | H01L 29/7813 257/334 |
| 2013/0049108 A1 | * | 2/2013 | Chen | H01L 29/7809 257/332 |
| 2013/0164919 A1 | * | 6/2013 | Park | H01L 21/02238 438/478 |
| 2015/0008517 A1 | * | 1/2015 | Mauder | H01L 29/7827 257/334 |
| 2015/0155355 A1 | * | 6/2015 | Losee | H01L 29/1608 257/77 |
| 2016/0099315 A1 | * | 4/2016 | Yilmaz | H01L 21/26586 257/139 |

* cited by examiner

US 10,373,958 B2

SEMICONDUCTOR DEVICE HAVING A MULTI-THICKNESS GATE TRENCH DIELECTRIC LAYER

CROSS REFERENCE TO RELATED APPLICATION

This application claims the priority from CN application No. 201710637712.8, filed Jul. 31, 2017, which is included in its entirety herein by reference.

BACKGROUND OF THE INVENTION

1. Field of the Invention

The present invention relates to the technical field of semiconductor manufacturing, and more particularly, to a semiconductor device and a method for fabricating the same.

2. Description of the Prior Art

Buried wordline structures are often used in dynamic random access memory (DRAM) to reduce the influence of short channel effects to the high density memory array. For a buried wordline structure, the key is to improve quality of the gate dielectric layer and its thickness control.

The improvement of the quality of the gate dielectric layer and its thickness control are closely related to the electrical performance and control of the device. In particular, in the area of gate-induced drain leakage (GIDL) and threshold voltage (Vt) control, this industry still need an effective solution.

SUMMARY OF THE INVENTION

It is one object of the present invention to provide an improved semiconductor device and a fabrication method that solve the deficiencies of the prior art.

One embodiment of the invention discloses a semiconductor device comprising a semiconductor substrate having a gate trench comprised of an upper trench and a lower trench. The upper trench is wider than the lower trench. A gate is embedded in the gate trench. The gate includes an upper portion and a lower portion. A first gate dielectric layer is between the upper portion and a sidewall of the upper trench. The first gate dielectric layer has a first thickness. A second gate dielectric layer is between the lower portion and a sidewall of the lower trench and between the lower portion and a bottom surface of the lower trench. The second gate dielectric layer has a second thickness that is smaller than the first thickness.

Another embodiment of the invention discloses a method for fabricating a semiconductor device. A semiconductor substrate is provided. An upper trench is formed in the semiconductor substrate. A first gate dielectric layer is deposited on interior surface of the upper trench. The first gate dielectric layer has a first thickness. The first gate dielectric layer and the semiconductor substrate are anisotropically etched, thereby forming a lower trench in a self-aligned manner. The upper trench and the lower trench constitute a gate trench. A second gate dielectric layer is thermally grown on interior surface of the lower trench. The second gate dielectric layer has a second thickness, and the second thickness is less than the first thickness.

These and other objectives of the present invention will no doubt become obvious to those of ordinary skill in the art after reading the following detailed description of the preferred embodiment that is illustrated in the various figures and drawings.

DETAILED DESCRIPTION

In the following, the details will be described with reference to the drawings, the contents of which also form part of the description of the specification and are illustrated in the specific examples in which the embodiment can be practiced. The following examples have described sufficient details to enable those of ordinary skill in the art to practice this invention.

Of course, other embodiments may be adopted, or any structural, logical, and electrical changes may be made without departing from the embodiments described herein. Therefore, the following detailed description is not to be taken in a limiting sense, and the examples contained therein are to be defined by the appended claims.

Figure 1:
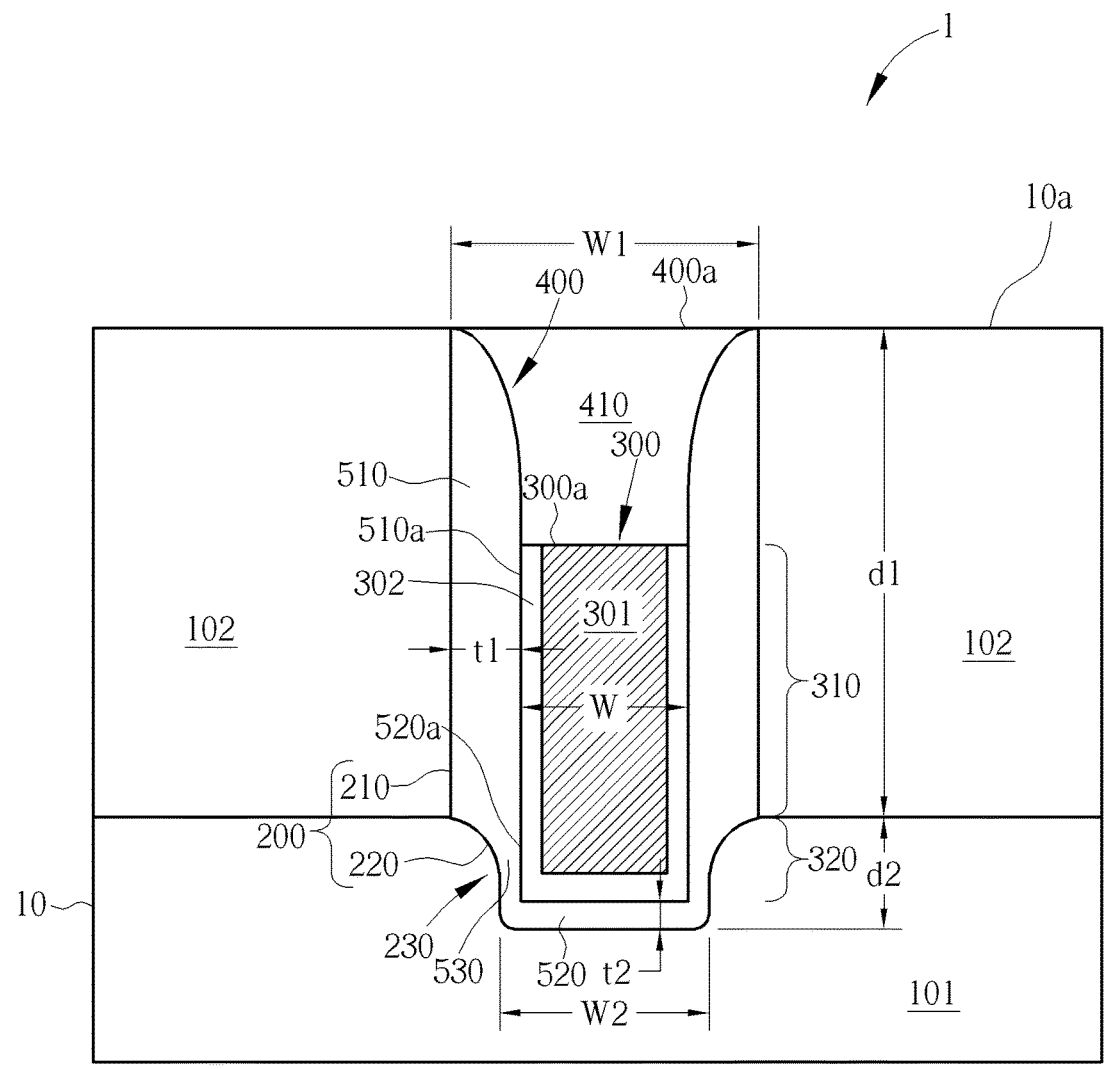
FIG. 1 is a cross-sectional view of a semiconductor device according to an embodiment of the present invention.

Please refer to FIG. 1, which is a cross-sectional view of a semiconductor device 1 according to an embodiment of the present invention. As shown in FIG. 1, the semiconductor device 1 includes a semiconductor substrate 10, for example, a silicon substrate, but is not limited thereto. The semiconductor substrate 10 has a top surface 10a. According to an embodiment of the present invention, the top surface 10a may be formed by a hard mask layer, but not limited thereto.

According to an embodiment of the present invention, a gate trench 200 is formed in the semiconductor substrate 10. According to an embodiment of the present invention, a P-type region 101 and an N-type region 102 may be formed in the semiconductor substrate 10. For example, the P-type region 101 may be a P well and the N-type region 102 may be an N$^+$ drain doped region or an N$^+$ source doped region, but is not limited thereto.

According to an embodiment of the present invention, the gate trench 200 includes an upper trench 210 and a lower trench 220. The width $w_1$ of the upper trench 210 is wider than the width $w_2$ of the lower trench 220. In FIG. 1, it can be seen that the depth $d_1$ of the upper trench 210 is approximately equal to the junction of the P-type region 101 and the N-type region 102, but not limited thereto.

According to an embodiment of the present invention, the depth of the lower trench 220 is further from the position of the depth $d_1$ of the upper trench 210 by a distance $d_2$, so that the depth of the lower trench 220 is $d_1+d_2$. According to an embodiment of the present invention, the lower trench 220 is located in the P-type region 101 and is located below the bottom of the N-type region 102.

According to an embodiment of the present invention, from the bottom of the upper trench 210, connected to the lower trench 220, there may be a transitional trench structure 230 tapered from the width $w_1$ to the width $w_2$.

According to an embodiment of the present invention, the semiconductor device 1 further comprises a gate 300 embedded in the gate trench 200. According to an embodiment of the present invention, the gate 300 includes an upper portion 310 and a lower portion 320. According to an embodiment of the present invention, the gate 300 includes a top surface 300a lower than the top surface 10a of the semiconductor substrate 10 to form a recessed region 400.

According to an embodiment of the present invention, the top surface 300a of the gate 300 is covered by a cap layer 410. According to an embodiment of the present invention, the cap layer 410 fills the recessed region 400 above the top surface 300a of the gate 300. For example, the cap layer 410 may be a silicon nitride layer, but not limited thereto. According to an embodiment of the present invention, the cap layer 410 has a top surface 400a that is flush with the top surface 10 a of the semiconductor substrate 10.

According to an embodiment of the present invention, the gate 300 has substantially the same width w in the gate trench 200. That is, the width of the upper portion 310 is substantially equal to the width of the lower portion 320.

According to an embodiment of the present invention, the semiconductor device 1 further comprises a first gate dielectric layer 510 disposed between the upper portion 310 and the sidewalls of the upper trench 210. The first gate dielectric layer 510 has a first thickness $t_1$. For example, the first thickness $t_1$ is between 60 angstroms and 80 angstroms.

According to an embodiment of the present invention, the semiconductor device 1 further comprises a second gate dielectric layer 520 disposed between the lower portion 320 and the sidewalls of the lower trench 220. The second gate dielectric layer 520 has a second thickness $t_2$, and the second thickness $t_2$ is less than the first thickness $t_1$. For example, the second thickness $t_2$ is between 40 angstroms and 60 angstroms. According to an embodiment of the invention, the second thickness $t_2$ of the second gate dielectric layer 520 may include a transitional thickness 530 corresponding to the aforementioned transitional trench structure 230 decreasing from the first thickness $t_1$ to the first thickness $t_1$.

According to an embodiment of the present invention, the first gate dielectric layer 510 includes an atomic layer deposition (ALD) silicon oxide layer and the second gate dielectric layer 520 includes an in-situ steam generation (ISSG) silicon oxide layer. According to an embodiment of the present invention, the first gate dielectric layer 510 includes a sidewall surface 510a vertically aligned with a sidewall surface 520 a of the second gate dielectric layer 520.

According to an embodiment of the present invention, the gate 300 may comprise a tungsten layer 301 and a titanium nitride (TiN) liner layer 302, wherein the TiN liner layer 302 is interposed between the tungsten layer 301 and the first gate dielectric layer 510 and between the tungsten layer 301 and the second gate dielectric layer 520.

The semiconductor device 1 of the present invention can be used in a dynamic random access memory as a buried wordline, wherein the first gate dielectric layer 510 is relatively thicker and can improve gate-induced drain leakage (GIDL). The second gate dielectric layer 520 formed by the in-situ steam generation (ISSG) process is a high-quality silicon dioxide layer whose thickness can be controlled within the desired target range to improve the threshold voltage control problem.

Please refer to FIG. 2 to FIG. 5, which illustrate a method of fabricating a semiconductor device according to another embodiment of the present invention.

Figure 2:
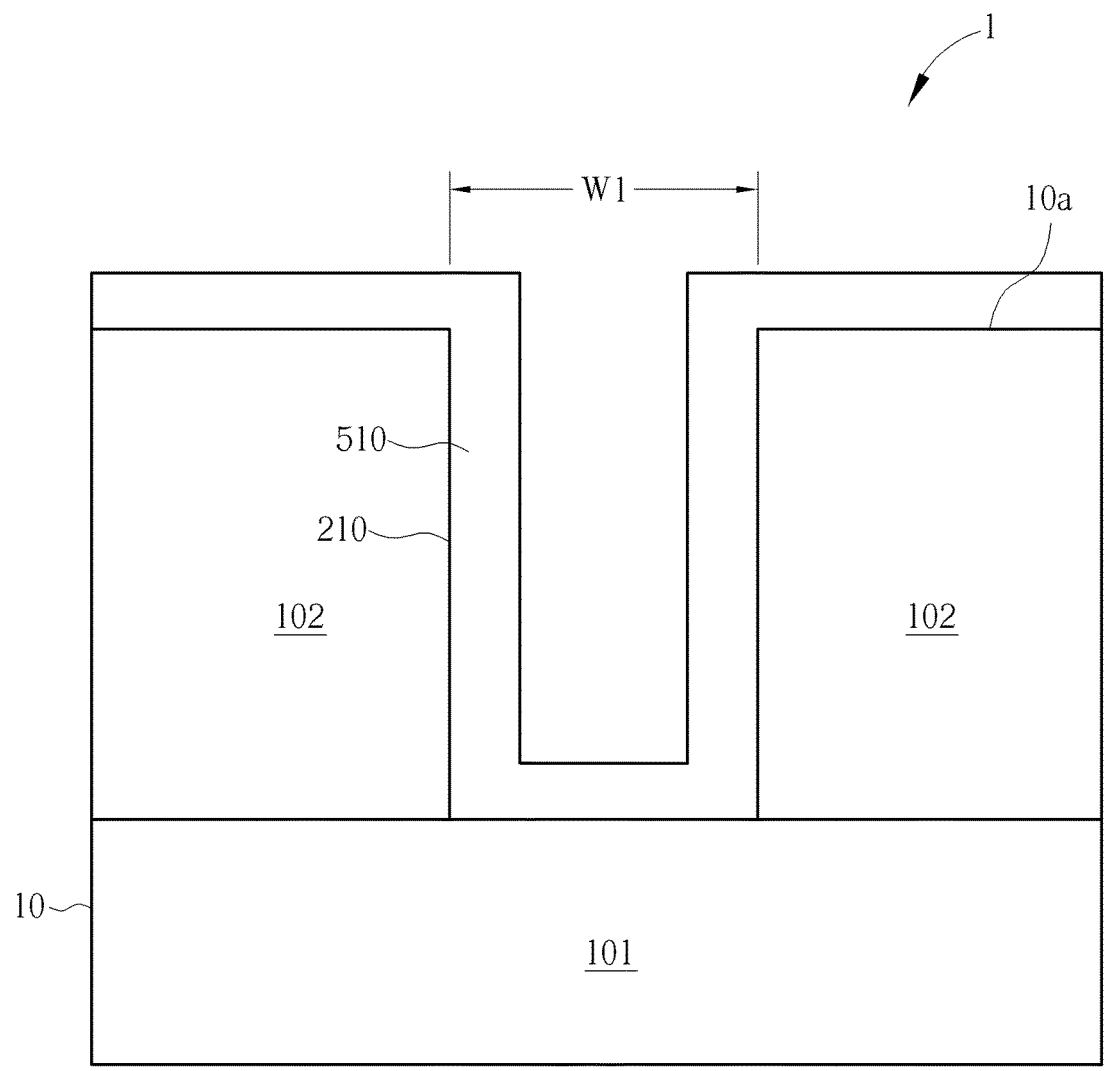
FIG. 2 to FIG. 5 show a method for fabricating a semiconductor device according to another embodiment of the present invention.

As shown in FIG. 2, a semiconductor substrate 10, such as a silicon substrate, is provided, but not limited thereto. The semiconductor substrate 10 has a top surface 10a. According to an embodiment of the present invention, a P-type region 101 and an N-type region 102 may be formed in the semiconductor substrate 10. For example, the P-type region 101 may be a P well, and the N-type region 102 may be an N+ drain doped region or an N+ source doped region, but is not limited thereto.

Next, an upper trench 210 is formed in the semiconductor substrate 10 by photolithography and etching processes. The upper trench 210 has a width $w_1$. Next, a first gate dielectric layer 510 is conformally deposited on the interior surface of the upper trench 210. For example, the first gate dielectric layer 510 may be a silicon dioxide layer deposited by an atomic layer deposition (ALD) process, but is not limited thereto. The first gate dielectric layer 510 has a first thickness $t_1$. For example, the first thickness $t_1$ is between 60 angstroms and 80 angstroms.

Figure 3:
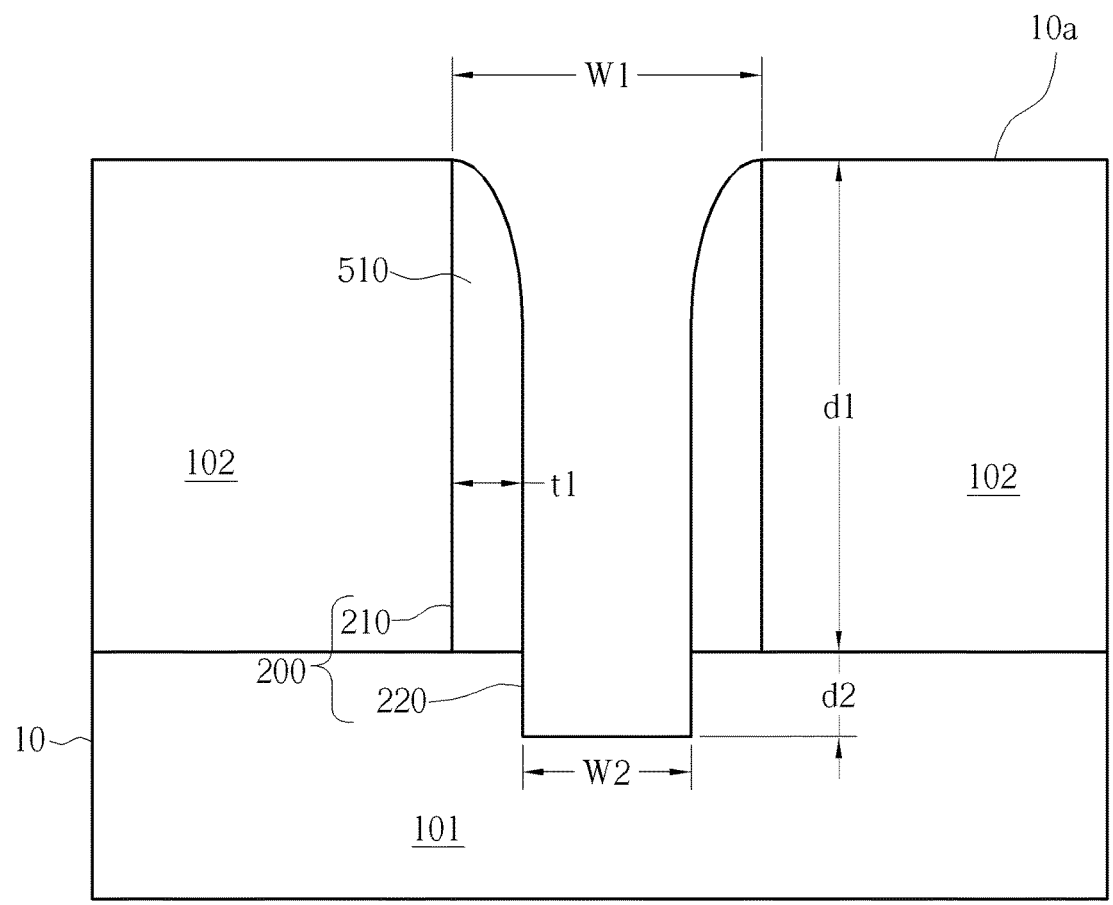

As shown in FIG. 3, the first gate dielectric layer 510 is then anisotropically etched, and after the first gate dielectric layer 510 is etched through, the etching is continued to etch the semiconductor substrate so as to form a lower trench 220 that is self aligned with the first gate dielectric layer 510. The upper trench 210 and the lower trench 220 constitute a gate trench 200.

According to an embodiment of the present invention, the lower trench 220 has a width $w_2$, wherein the width $w_1$ of the upper trench 210 is wider than the width $w_2$ of the lower trench 220. In FIG. 3, it can be seen that the depth $d_1$ of the upper trench 210 is approximately at the junction between the P-type region 101 and the N-type region 102, but is not limited thereto.

According to an embodiment of the present invention, the depth of the lower trench 220 is further from the position of the depth $d_1$ of the upper trench 210 by a distance $d_2$, so that the depth of the lower trench 220 is $d_1+d_2$. According to an embodiment of the present invention, the lower trench 220 is located in the P-type region 101 and is located below the bottom of the N-type region 102.

Figure 4:
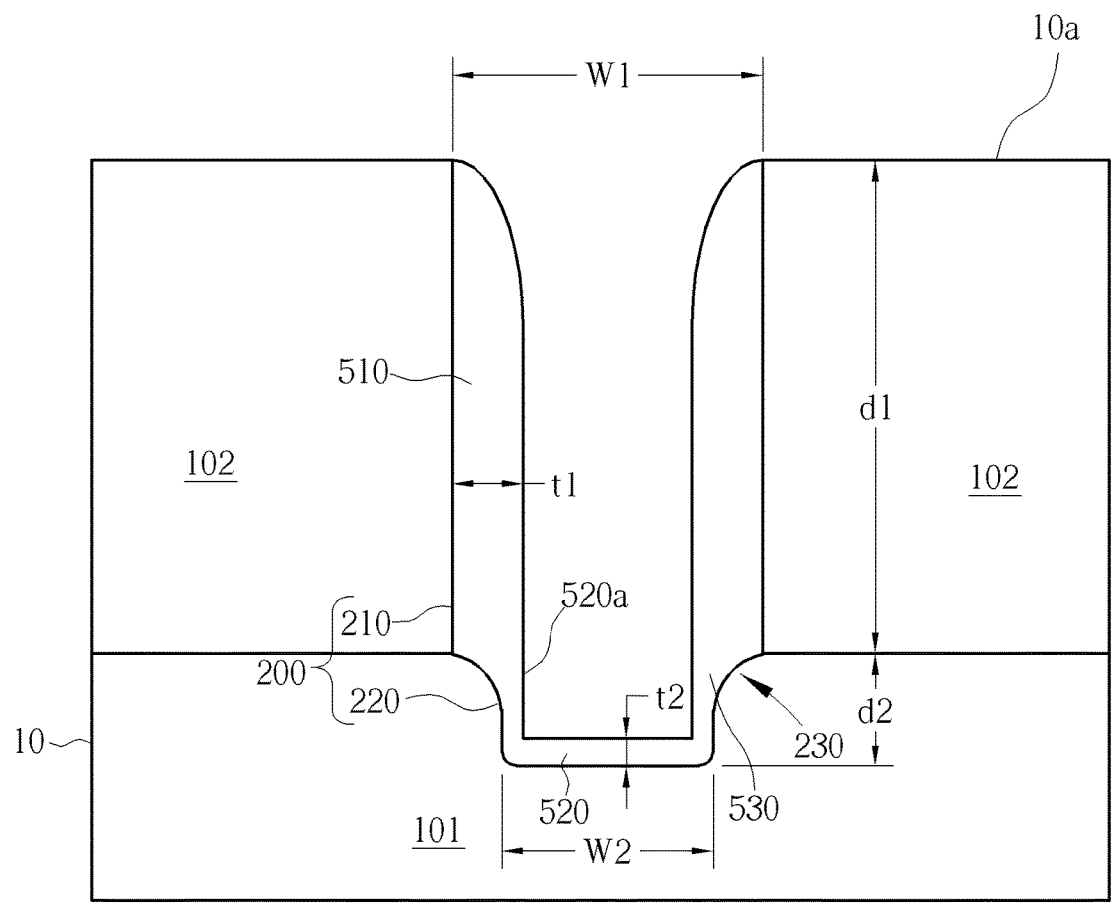

As shown in FIG. 4, a second gate dielectric layer 520 is then thermally grown from the interior surface of the lower trench 220 by an in-situ steam generation (ISSG) process. The second gate dielectric layer 520 has a second thickness $t_2$, and the second thickness $t_2$ is less than the first thickness $t_1$. For example, the second thickness $t_2$ is between 40 angstroms and 60 angstroms.

In addition, the aforementioned ISSG process can further improve the film quality of the first gate dielectric layer 510. For example, defects in the first gate dielectric layer 510 can be repaired or structurally denser. In some embodiments, the thickness of the first gate dielectric layer 510 may increase slightly after the above-described ISSG process.

According to an embodiment of the present invention, from the bottom of the upper trench 210, connected to the lower trench 220, there may be a transitional trench structure 230 tapered from the width $w_1$ to the width $w_2$. The second thickness $t_2$ of the second gate dielectric layer 520 may include a transitional thickness 530 corresponding to the aforementioned transitional trench structure 230 decreasing from the first thickness $t_1$ to the first thickness $t_1$.

According to an embodiment of the present invention, the first gate dielectric layer 510 comprises a sidewall surface 510a vertically aligned with a sidewall surface 520a of the second gate dielectric layer 520.

Figure 5:
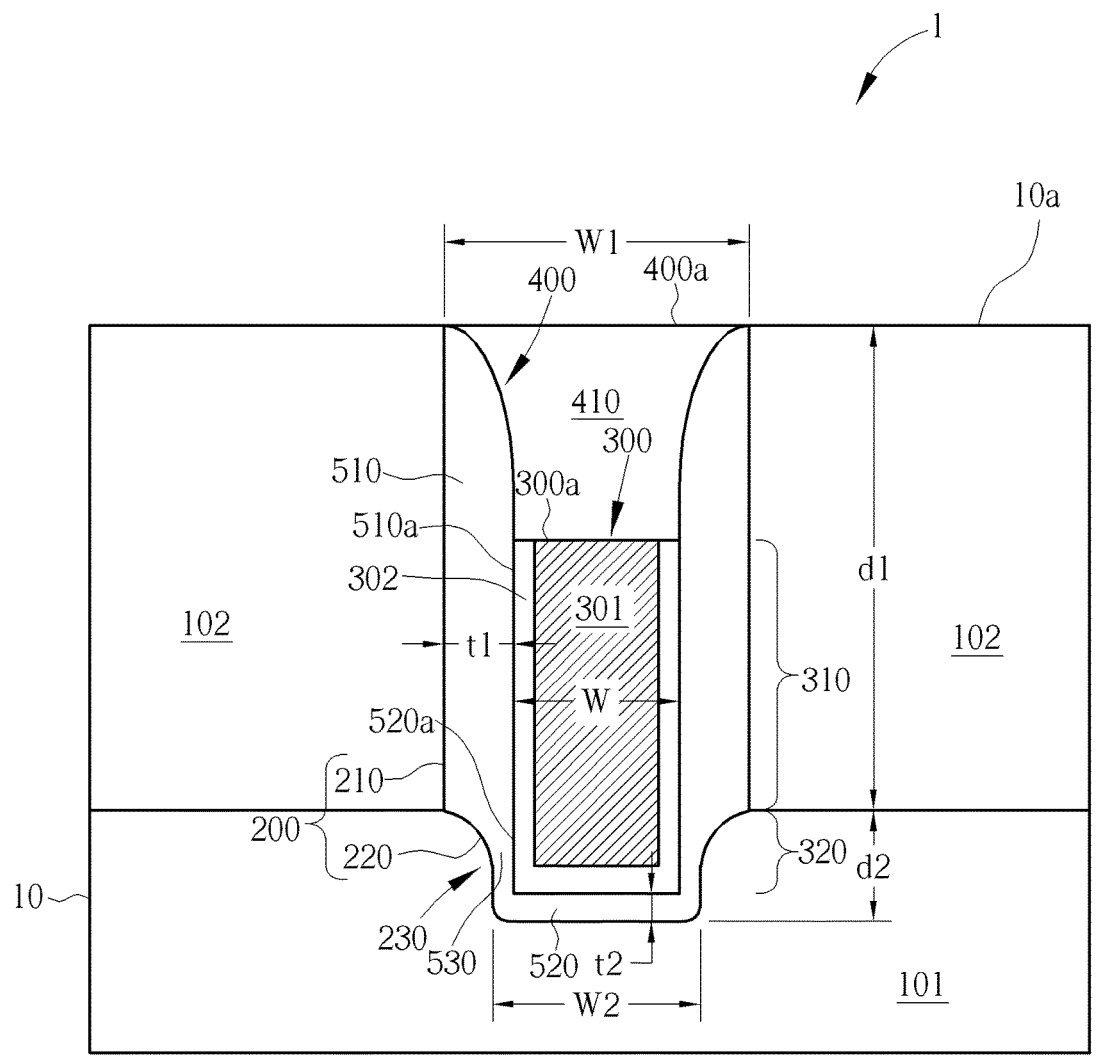

As shown in FIG. 5, a gate 300 is formed in the gate trench 200. According to an embodiment of the present invention, the gate 300 may comprise a tungsten layer 301 and a titanium nitride (TiN) liner layer 302, wherein the TiN liner layer 302 is interposed between the tungsten layer 301 and the first gate dielectric layer 510 and between the tungsten layer 301 and the second gate dielectric layer 520.

According to an embodiment of the present invention, the gate 300 is embedded in the gate trench 200. According to an embodiment of the present invention, the gate 300 includes an upper portion 310 and a lower portion 320. According to an embodiment of the present invention, the gate 300 includes a top surface 300*a* lower than the top surface 10*a* of the semiconductor substrate 10 to form a recessed region 400.

According to an embodiment of the present invention, the top surface 300*a* of the gate 300 is covered by a cap layer 410. According to an embodiment of the present invention, the cap layer 410 fills the recessed region 400 above the top surface 300*a* of the gate 300. For example, the cap layer 410 may be a silicon nitride layer, but not limited thereto. According to an embodiment of the present invention, the cap layer 410 has a top surface 400*a* that is flush with the top surface 10*a* of the semiconductor substrate 10.

According to an embodiment of the present invention, the gate 300 has a uniform width w through the depth the depth of the gate trench 200. That is, the width of the upper portion 310 is substantially equal to the width of the lower portion 320.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate having a gate trench comprised of an upper trench and a lower trench, wherein the upper trench is wider than the lower trench;
   a gate embedded in the gate trench, wherein the gate comprises an upper portion and a lower portion;
   a first gate dielectric layer between the upper portion and the upper trench, wherein the first gate dielectric layer has a first thickness; and
   a second gate dielectric layer between the lower portion and the lower trench, wherein the second gate dielectric layer has a second thickness that is smaller than the first thickness, wherein the gate comprises a tungsten layer and TiN liner layer, wherein the TiN liner layer is disposed between the tungsten layer and the first gate dielectric layer and between the tungsten layer and the second gate dielectric layer.

2. The semiconductor device according to claim 1, wherein the gate has a uniform width throughout depth of the gate trench.

3. The semiconductor device according to claim 2, wherein the upper portion of the gate has a width that is equal to that of the lower portion of the gate.

4. The semiconductor device according to claim 1, wherein the gate trench has a trench width gradually decreased from its top to its bottom.

5. The semiconductor device according to claim 1, wherein the first gate dielectric layer comprises an atomic layer deposition (ALD) silicon oxide layer.

6. The semiconductor device according to claim 5, wherein the first thickness ranges between 60 and 80 angstroms.

7. The semiconductor device according to claim 1, wherein the second gate dielectric layer comprises an in-situ steam generation (ISSG) silicon oxide layer.

8. The semiconductor device according to claim 7, wherein the second thickness ranges between 40 and 60 angstroms.

9. The semiconductor device according to claim 1, wherein the first gate dielectric layer comprises a surface that is aligned with a surface of the second gate dielectric layer.

* * * * *